United States Patent [19]

Tran

[11] Patent Number: 5,627,778
[45] Date of Patent: May 6, 1997

[54] DRAM SENSING SCHEME

[75] Inventor: Hiep V. Tran, Carrollton, Tex.

[73] Assignee: Texas Instruments Incorporated, Dallas, Tex.

[21] Appl. No.: 557,249

[22] Filed: Jul. 24, 1990

[51] Int. Cl.⁶ .................................................. G11C 11/40
[52] U.S. Cl. ..................... 365/149; 365/203; 365/208; 365/210; 365/230.06; 365/230.04
[58] Field of Search ................................. 365/207, 208, 365/210, 203, 230.06, 230.04, 149

[56] References Cited

U.S. PATENT DOCUMENTS

| | | | |
|---|---|---|---|
| 4,223,394 | 9/1980 | Pathak et al. | 365/207 |
| 4,636,664 | 1/1987 | Craycraft et al. | 365/203 |
| 4,638,459 | 1/1987 | Pechar et al. | 365/203 |
| 4,897,568 | 1/1990 | Chem et al. | 365/207 |
| 4,943,952 | 7/1990 | Terayama | 365/203 |
| 4,972,378 | 11/1990 | Kitagawa et al. | 365/210 |
| 4,992,980 | 2/1991 | Park et al. | 365/230.24 |
| 5,016,216 | 5/1991 | Ali | 365/230.06 |
| 5,020,025 | 5/1991 | Nix et al. | 365/210 |
| 5,027,321 | 6/1991 | Park | 365/230.06 |

OTHER PUBLICATIONS

S.Sze, "Semiconductor Devices–Physics and Technology," ©1985 Bell Tel. Labs, Inc., TK7871.85.S9883, pp. 43, 44.

*Primary Examiner*—Joseph E. Clawson, Jr.
*Attorney, Agent, or Firm*—Carlton H. Hoel; W. James Brady, III; Richard L. Donaldson

[57] ABSTRACT

A memory sensing scheme is disclosed which does not require the use of a dummy cell. The memory sensing scheme uses charge injection and parasitic capacitive coupling to distinguish the logical content of a memory cell.

16 Claims, 4 Drawing Sheets

DRAM SENSING SCHEME

BACKGROUND OF THE INVENTION

Conventional sensing schemes for random access memories use dummy cells in order to provide a measure of comparison when determining the state (logic 1 or logic 0) of a memory cell. However, in 64 megabit random access memories and beyond, particularly dynamic random access memories (DRAMs), the space required to implement a dummy cell in a sensing scheme is generally not available. Thus, a need exists to provide a memory cell sensing scheme which does not require the use of a dummy cell.

OBJECTS OF THE INVENTION

It is an object of the invention to provide a new and improved memory sensing scheme.

It is another object of the invention to provide a new and improved DRAM sensing scheme.

It is a further object of the invention to provide a new and improved DRAM sensing scheme which does not require the use of a dummy cell.

These and other objects of the invention together with the features and advantages thereof will become apparent from the following detailed specification when read together with the accompanying drawings in which applicable reference numerals have been carried forward.

SUMMARY OF THE INVENTION

The foregoing objects of the invention are accomplished by an improved DRAM sensing scheme which uses a charge injection circuit to adjust the voltage potentials of a second bit line with respect to a first bit line. The first bit line receives any charge from the memory cell whose state must be sensed. Next, the voltage potential of the first bit line is compared with the voltage potential of the second bit line. The comparison can be accomplished by a comparator.

DETAILED DESCRIPTION OF THE INVENTION

Figure 1:
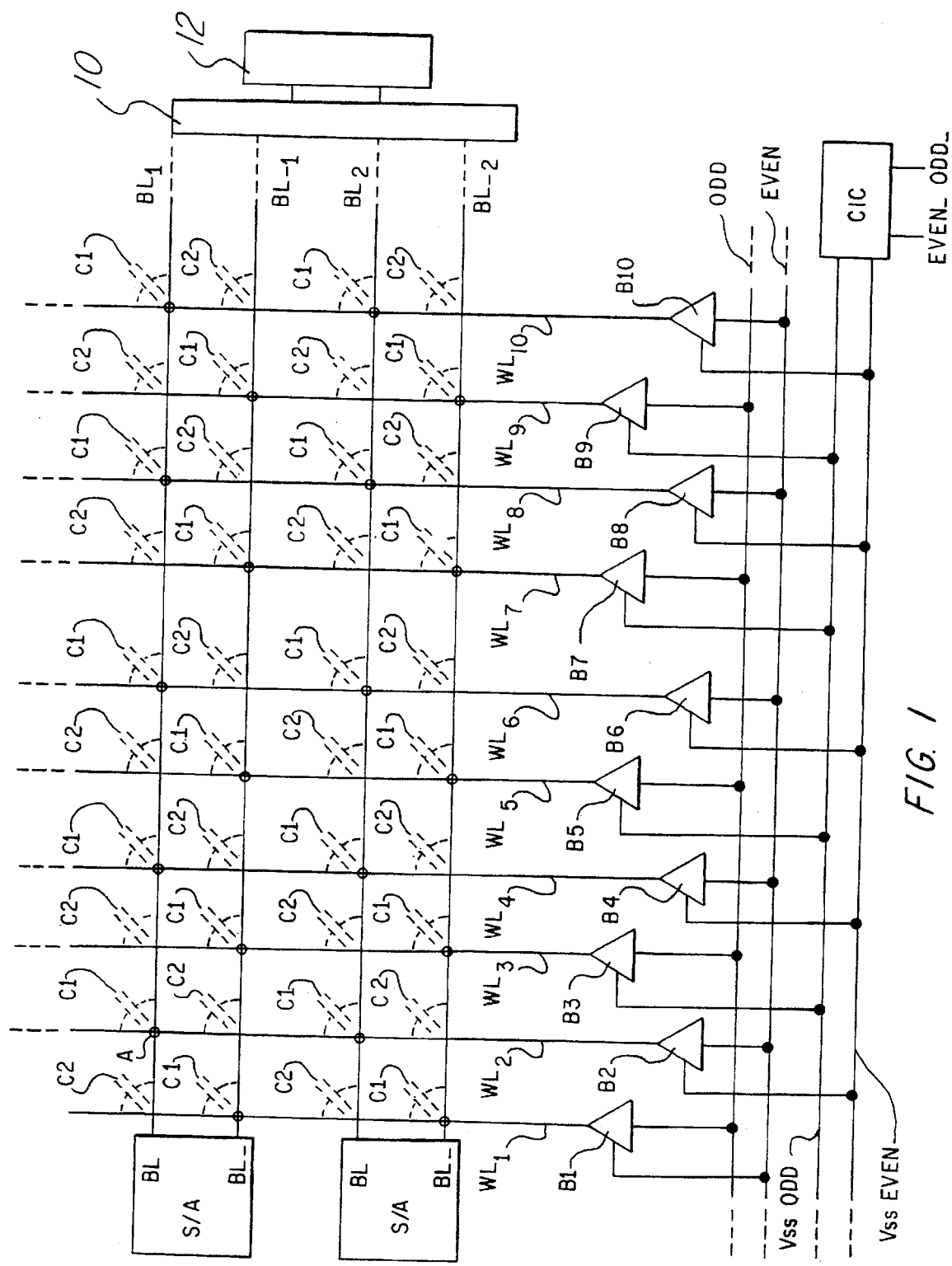
FIG. 1 illustrates a representative portion of a dynamic random acess memory sensing circuit.

FIG. 1 illustrates a representative portion of a dynamic random access memory sensing circuit. Sense amplifiers S/A are connected to bit line pairs BL and BL_, with each bit line from the pair shown with subscripted labeling and carrying signals which complement one another, i.e. if one signal is logic high, the other signal must be logic low and vice versa. Logic high and logic low shall represent digital values of 1 and 0, respectively, assigned to states such as, voltages above or below a predetermined threshold. This threshold can vary so allow the above terms to apply to analog voltages. All bit line pairs are input to multiplexer 10 which is connected to comparator 12. Word lines WL (each being further labeled with an identifying subscript consistent with an even/odd numbering dichotomy for the word lines) are shown perpendicular to the bit lines. Memory cells are represented as circles (one of which is labeled A) at the intersection of bit lines and word lines. Only one bit line from a pair of bit lines (the one shown drawn through the circle representing the memory cell) carries information capable of representing a memory state (logic high or logic low) to and from a memory cell. The other bit line from the pair primarily serves only the sensing function of the circuit as will be explained further. The word lines are connected to buffers labeled B1, B2, B3, and B4. The buffers can comprise decoders for word line selection. Even numbered buffers connect to a control line labeled EVEN while odd numbered buffers connect to a control line labeled ODD. The control lines aid in decoding the selection of word line selection. Consequently, the selection of an even subscripted word line will result in a logic high EVEN line. Alternatively, the selection of an odd subscripted word line will result in a logic high ODD line. EVEN and ODD control lines work in complementary fashion like that of bit lines BL and BL_. Consequently, when the signal on the EVEN control line is at a logic high level, the signal on control line ODD is at a logic low level and vice versa. Lines at voltage Vss connect to the buffers such that odd numbered buffers are connected to line Vss ODD while even numbered buffers connect to line Vss EVEN. A charge injection circuit connects to input ODD_, input EVEN_, line Vss ODD, and line Vss EVEN. Input ODD_ carries a signal which complements that on line ODD, while line EVEN_ carries a signal which complements that on line EVEN. Parasitic capacitors C1 and C2 are shown connected between word lines and bitlines. Capacitor C1 is connected to the bit line which either receives or sends charge to the memory cell. Consequently, parasitic capacitor C1 is larger than capacitor C2.

Figure 2A:
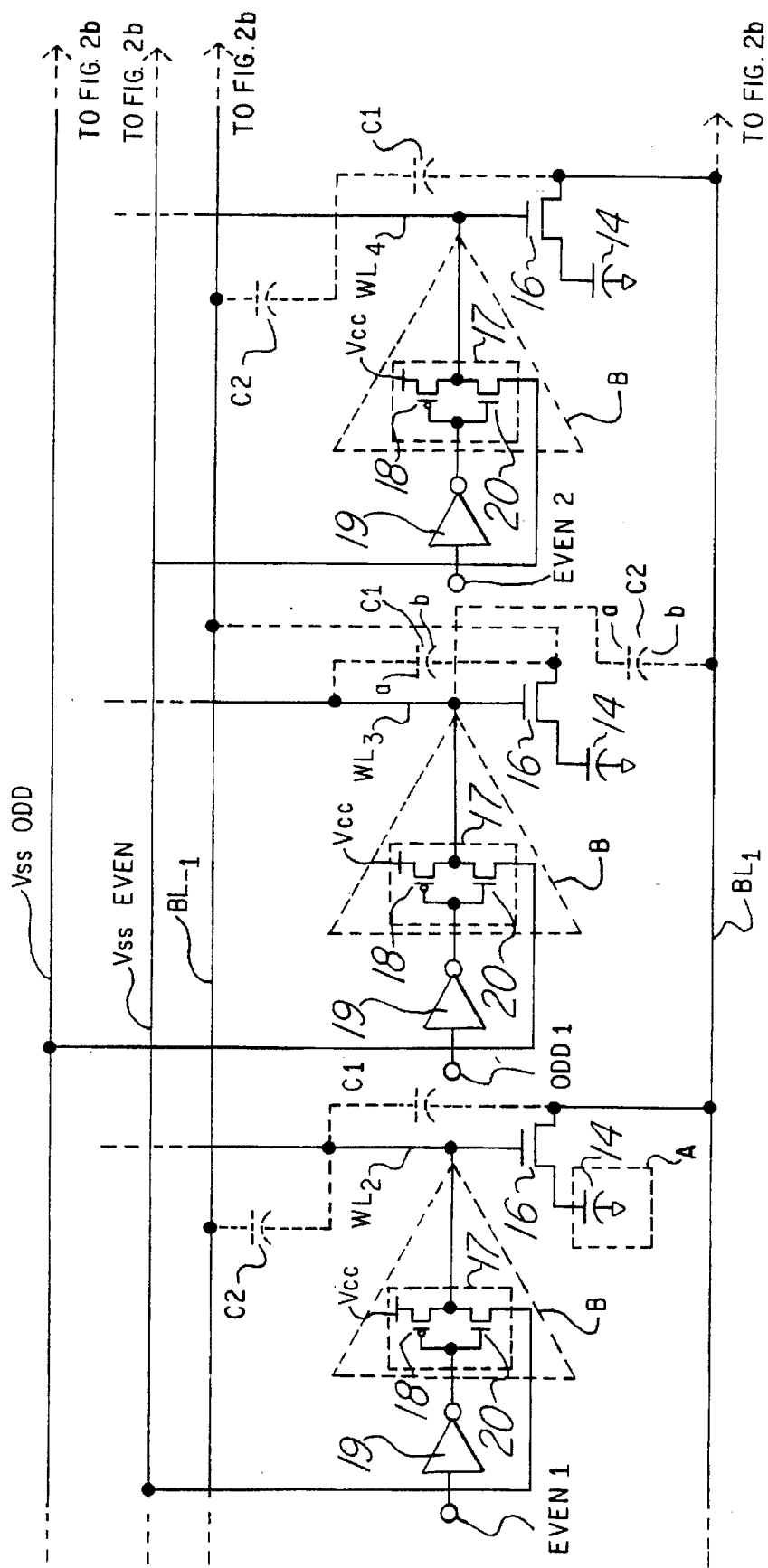
FIGS. 2a and 2b illustrate a schematic drawing of an example which shows the relationship of capacitors C1 and C2 to the word lines and the bit lines.
Figure 2B:
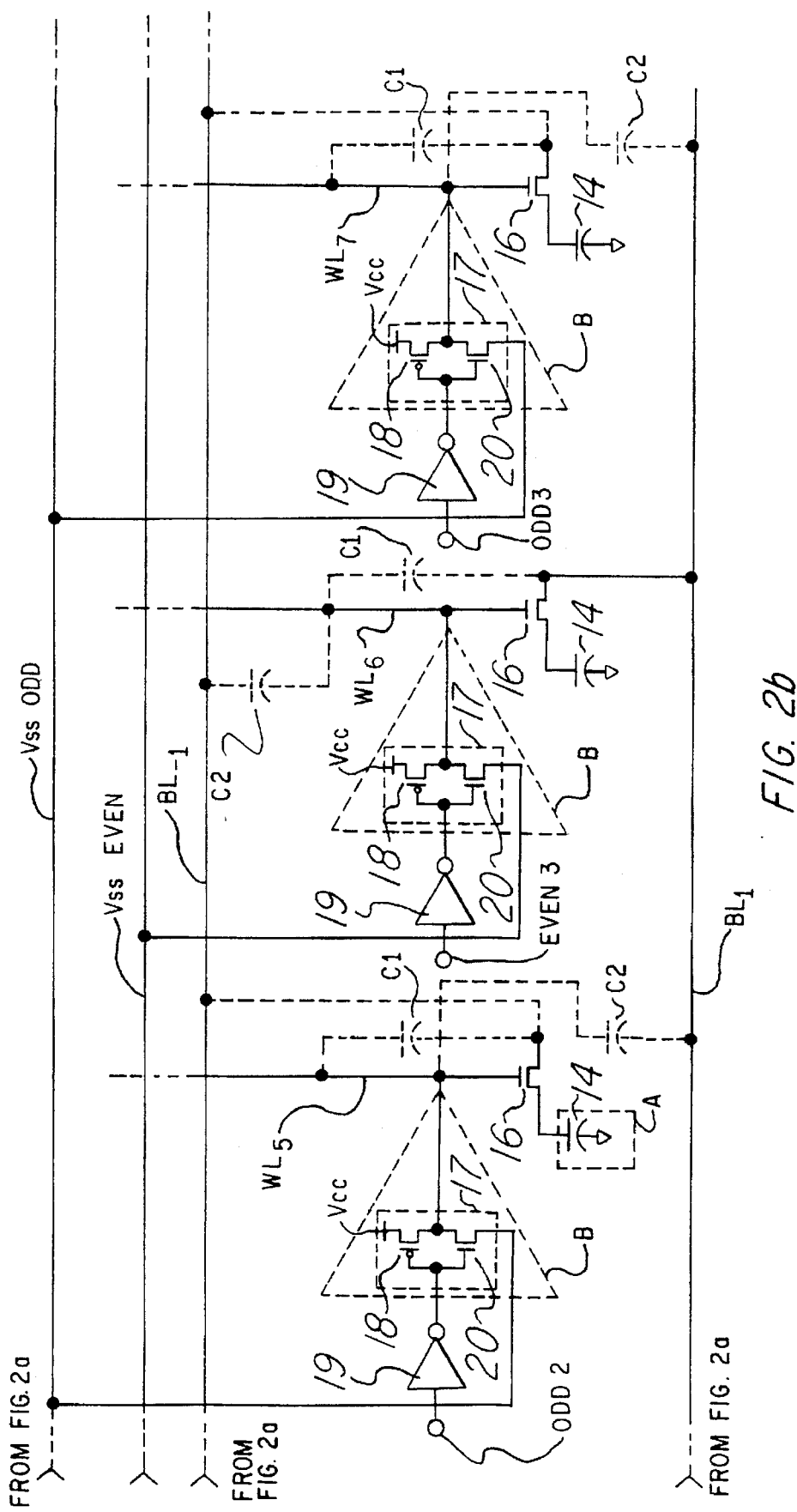

FIGS. 2a and 2b illustrate schematic drawings of an example which shows the relationship of capacitors C1 and C2 to the word lines and bit lines with more specificity. This example is given with respect to subscripted word lines WL2 through WL7. Bit line BL receives and transmits charge to and from a memory cell represented as capacitor 14. In particular, one memory cell is further identified as memory cell "A." As shown, capacitor 14 is connected to field effect pass transistor 16. Parasitic capacitors C1 and C2 are connected to and between a word line and bit line as discussed previously. Numbered EVEN and ODD inputs connect to an associated inverter 19 whose output is connected to the input of inverter 17 which comprises p-channel transistor 18 connected to n-channel transistor 20. Inputs EVEN1, EVEN2 and EVEN3 are the result of a signal on line EVEN from FIG. 1 in conjuction with multiplexing that allows input to one specific gate. The source of transistor 18 is at a voltage of Vcc. The source of transistor 20, for the even subscripted word lines, is connected to line Vss ODD. For the case with odd subscripted word lines, the source of transistor 20 is connected to line Vss EVEN.

Figure 3:
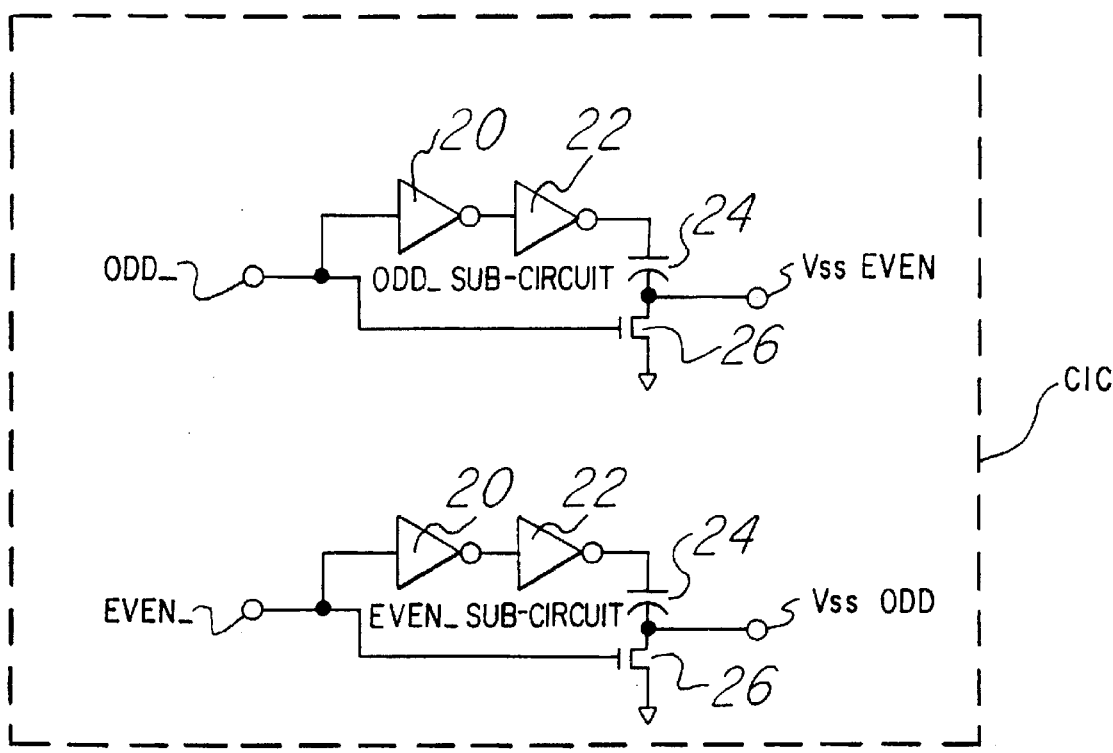
FIG. 3 illustrates a schematic drawing of a first preferred embodiment of the invention's charge injection circuit.

FIG. 3 illustrates a schematic drawing of a first preferred embodiment of the invention's charge injection circuit. Charge injection circuit, CIC, is divided into two quasi symmetrical sub-circuits: an ODD_ sub-circuit whose input, ODD_, receives the complement of the signal on control line ODD and an EVEN_ sub-circuit whose input, EVEN_, receives the complement of the signal on control line EVEN. Each symmetrical sub-circuit comprises two series connected inverters 20 and 22 coupled to and between capacitor 24 and the gate of field effect transistor 26. In sub-circuit ODD_, a signal on line Vss EVEN is output from the node between capacitor 24 and transistor 26 which is connected to an associated Vss line. Similarly, in sub-circuit EVEN_, a signal Vss ODD is output from the node between capacitor 24 and transistor 26. If the input to a sub-circuit is at a logic high level, the Vss line for that sub-circuit carries a logic low signal as a result of being pulled down by transistor 26. However, if the input to a sub-circuit changes from a logic high to a logic low level, transistor 26 shuts off and the bottom plate of capacitor 24 changes in potential so as to push its associated Vss line even lower in potential through capacitive coupling.

In connection with sensing the state of a memory cell, a word line is selected. With reference to FIG. 1, a logic high EVEN signal in conjunction with multiplexing circuitry (not shown) will turn on a single one of the even subscripted word lines. Alternatively, a logic high ODD signal in conjunction with multiplexing circuitry (not shown) will turn on a single one of the odd subscripted word line. For example, with reference to FIG. 2a, word line WL2 is selected. Thus, a logic high signal through line EVEN of FIG. 1 is sent to input EVEN1 of inverter 19 through multiplexing circuitry (not shown). Transistor 18 therefore turns on and pulls word line WL2 up in voltage, thereby accomplishing word line selection. With reference to FIG. 3, the selection of an even subscripted word line results at the CIC, in a low logic level at input EVEN_ and a high logic level at input ODD_. Alternatively, the selection of an odd subscripted word line results in a low logic level at input ODD_ and a high logic level at input EVEN_. Consequently, with this example in which word line WL2 is selected, a logic low level will result at input EVEN_ causing Vss ODD to be pulled to the "even lower in potential state" discussed above with respect to FIG. 3. This voltage change to the "even lower . . . " voltage value for Vss ODD, for instance a −1 volt, is transfered via the source of transistor 20, to one plate of each parasitic capacitor C1 and C2 associated with the non-selected odd subscripted word lines. (Note that the inputs to inverter 19 are low in the case of all unselected word lines. For example, all inputs with the exception of input EVEN1 receives a low signal to keep all unselected word lines off. Assuming bit lines BL and BL_ are at a floating voltage level, the other plates of capacitors C1 and C2 of odd subscripted word lines connected directly to the bit lines drop down in voltage by an amount equal to −1 volts times the capacitance of capacitor C1 or capacitor C2 divided by the total capacitance of each bit line. For example, in FIG. 2a, if an even word line is selected and Vss ODD and, consequently, plate a of capacitor C1 drop down in voltage by −1 volt, plate b of capacitor C1 and consequently bit line BL_ drop down in voltage by (via capacitive coupling) −1 volt times the capacitance of capacitor C1 divided by the total capacitance of bit line BL_. Similarly, bit line BL and plates a and b of capacitor C2 drop in voltage. Hence, the term charge injection applies to this phenomenon since an associated charge is placed on the bit lines through parasitic capacitors C1 and C2 in connection with the drop in voltage on their capacitor plates. Since capacitor C1 is larger than capacitor C2, more charge is injected onto a bit line by capacitor C1 than by C2. Thus one bit line (the subscripted complement of the bit line serving the selected memory cell) drops down in voltage by a greater amount than the other.

The difference in charge injected between bit lines which results via the foregoing described charge injection method is determined from equation (1) which follows:

$$Q = \frac{(V_{REF} - V_{EE})C3}{C4} * (C1 - C2)N \quad (1)$$

Q is the difference between the amount of charge injected onto the bit lines of a pair. N is the number of odd subscripted word lines connected to Vss ODD should an even subscripted word line be selected. Alternatively, N is the number of even subscripted word lines connected to Vss EVEN should an odd subscripted word line be selected. C4 represents the total capacitance of all capacitances connected to Vss lines of type opposite of that selected (type referring to either even or odd). C3 is the capacitance of capacitor of the charge injection circuit of FIG. 3. C1 and C2 represent the capacitance of capacitors C1 and C2, respectively, of FIG. 1. $V_{REF}$ and $V_{EE}$ are the voltages required to power inverters 20 and 22.

A logic high or as it is sometimes called, a logic 1 value, from the selected memory cell will cause the bit line for access to the selected memory cell to rise in potential over that of the other bit line of the pair. A logic low or rather logic 0 value from the selected cell will cause the bit line for access to the selected to be lower in potential than that of the other bit line of the pair. A cell containing either a logic one value or a logic zero value will be accordingly sensed as as such by comparator 12 of FIG. 1 through comparison of the voltages on a pair of bit lines. For instance, consistent with the selection of word line WL2 in the example above, if memory cell A of FIG. 2 must be read the contents of memory cell A is placed on bit line $BL_1$ through its associated pass transistor 16 since its associated inverter 17 outputs a high signal on the gate of the same pass transistor 16 through word line WL2. If memory cell A carried a logic 1 (a logic high value) then the potential of bit line $BL_1$ is raised above bit line $BL_{-1}$. Referring to FIG. 1, multiplexer 10 passes bit lines $BL_1$ and $BL_{-1}$ to comparator 12. Comparing the voltages on bit lines $BL_1$ and $BL_{-1}$, comparator 12 will in turn sense a logic 1 value in cell A. Alternatively, if cell A contained a logic 0 (logic low) value, then bit line $BL_{-1}$ will be higher in value than bit line $BL_1$ and comparator 12 will sense a logic 0 value in cell A.

Figure 4:
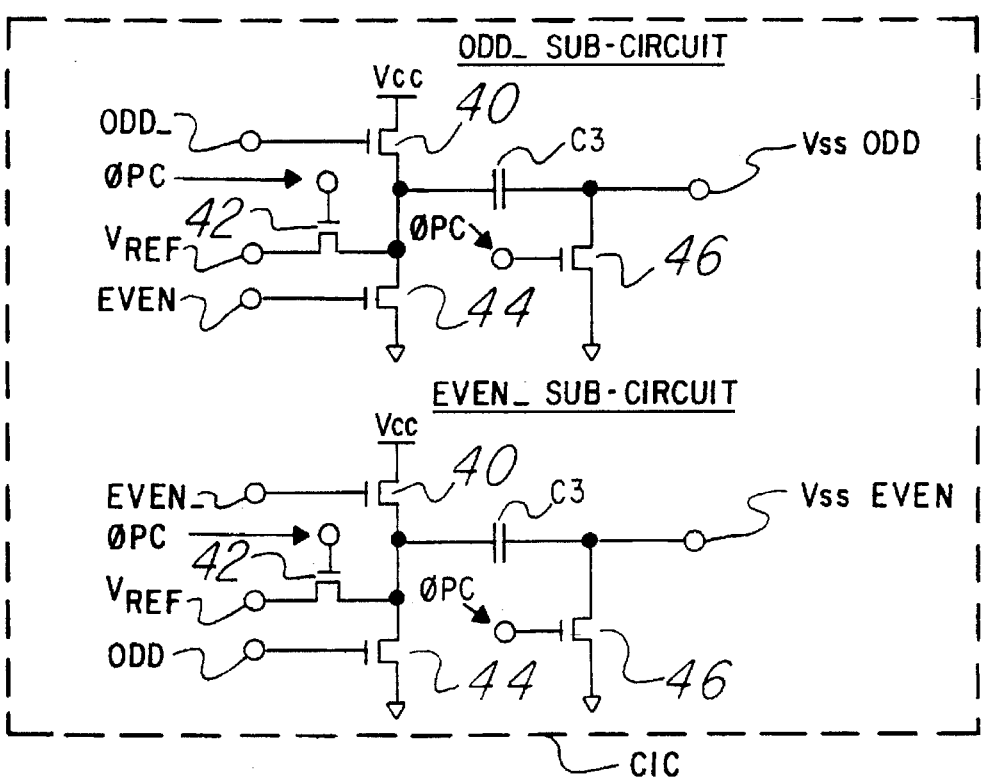
FIG. 4 illustrates a schematic drawing of an alternative embodiment of the invention's charge injection circuit comprising two quasi-symmetrical sub-circuits.

FIG. 4 illustrates a schematic drawing of an alternative embodiment of charge injection circuit CIC comprising two quasi symmetrical sub-circuits (ODD_ sub-circuit and EVEN_ sub-circuit). As shown, n-channel transistor 40 connects to n-channel transistor 42 and n-channel transistor 44. A supply voltage of Vcc is supplied to the drain of transistor 40. Voltage Vref is received by a drain/source of transistor 42. The gate of transistor 40 receives at input ODD_, the complement of a signal on line ODD in the ODD_ sub-circuit while the gate of transistor 40 in the EVEN_ sub-circuit receives at input EVEN_, the complement of the signal on line EVEN. Transistor 44 is connected to the EVEN control line in sub-circuit ODD_, while transistor 44 is connected to the ODD control line in sub-circuit EVEN_. N-channel transistor 46 is connected to capacitor C3 and to either line Vss ODD (ODD_ sub-circuit) or line Vss EVEN (EVEN_ sub-circuit). The gates of both transistors 42 and 46 receive precharge signal 0PC. In operation, precharge signal 0PC is energized and a charge is thus placed on one terminal of capacitor C3. One terminal of C3 from both the ODD_sub-circuit and the EVEN_ sub-circuit is pulled to circuit ground by 0PC-activated transistor 46. The other terminal of capacitor C3 is substantially at a voltage of VREF, the voltage received by the drain of transistor 42. After precharge signal 0PC is turned off, if line EVEN from the EVEN_ sub-circuit is at a logic low (meaning line ODD is at a logic high level and thus line ODD_ is at logic low level) then the terminal of capacitor C3, connected to a Vss line, maintains its voltage level at circuit ground. But if after precharge signal 0PC is turned off, line EVEN drops to logic low in response to an odd subscripted word line selection or line ODD drops to logic low in response to an even subscripted word line selection as discussed previously the Vref potentialed terminal of the associated capacitor C3 is yanked down to substantially circuit ground value. This accordingly causes the other terminal of the capacitor which is connected either to VSS ODD in the ODD sub-circuit or to line Vss EVEN in the EVEN_ sub-circuit to drop in voltage by the same amount through capacitive coupling, thereby accomplishing the same task as the charge injection circuit of FIG. 3. The difference in charge injected between bit lines of the pair receiving the injected charge is as follows in equation (2) where the symbols below represent the same quantities as in equation 1, and Vcc and Vref are the values of the voltage potentials discussed above.

$$(Vcc-Vref)\ (C3/C4)\ (C1-C2)N \qquad (2)$$

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to and may be made by, persons of ordinary skill in the art having reference to this description. For instance, the field effect transistors shown are preferably of the MOS (metal oxide semiconductor) type. However, other insulators besides oxides in the transistors can be used. Additionally, bipolar transistors can conceivably replace some of the field effect transistors shown. Further, n-type transistors can be substituted for p-type transistors and vice versa, consistent with the desired circuit operation. Note also that although charge injection has been discussed for bit lines of opposite parity from the bit line for connection to the selected memory cell, charge injection can take place on the bit line of the same parity prior to bit line comparision for memory cell state determination. It is contemplated that all such changes and additional embodiments are within the spirit and true scope of the invention as claimed below.

I claim:

1. A memory cell sensing scheme comprising:
   at least one pair of bit lines;
   a plurality of decoders capable of being coupled to said bit lines;
   a pair of low power supply voltage rails selectively connected to said decoders;
   a charge injection circuit connected to said pair of low power supply voltage rails; and
   a comparator capable of being coupled to said at least one pair of bit lines.

2. A memory cell sensing scheme as recited in claim 1 wherein said decoders include a complementary field effect transistor inverter.

3. A memory cell sensing scheme as recited in claim 1 wherein said charge injection circuit includes two circuits which each comprise:
   a capacitor; and
   a transistor in series with said capacitor.

4. A memory cell sensing scheme as recited in claim 3 wherein each said two circuit further include at least two inverters, said transistor being in series with said inverters and said capacitor.

5. A memory cell sensing scheme as recited in claim 1 wherein said charge injection circuit includes two circuits which each comprise:
   three transistors connected together at their drains;
   a capacitor connected by a first terminal to the drains of said three transistors; and
   a fourth transistor connected to the remaining terminal of said capacitor.

6. A memory cell as recited in claim 5 wherein said transistors are field effect transistors.

7. A memory cell as recited in claim 1 wherein said decoders are each connected to a selected parity line and a low voltage power supply rail of the same parity.

8. A memory cell as recited in claim 1 which further includes a multiplexer connected to and between said bit lines and said comparator.

9. A method for sensing the state of a memory cell comprising:
   allowing access of charge from a selected memory cell to a first bit line;
   injecting charge to a second bit line; and
   comparing the electrical states of said first bit line with said second bit line.

10. A method as recited in claim 9 wherein said electrical states are bit line voltages.

11. A method as recited in claim 9 wherein said charge is injected through a parasitic capacitor.

12. A method as recited in claim 9 wherein said charge is injected through word line decoding circuitry of opposite parity as that of said selected memory cell.

13. A method for sensing the state of a memory cell comprising:
   allowing access of charge from a selected memory cell to a first bit line;
   injecting charge to said first bit line; and
   comparing the electrical states of said first bit line with a second bit line.

14. A method as recited in claim 13 wherein said electrical states are bit line voltages.

15. A method as recited in claim 13 wherein said charge is injected through a parasitic capacitor.

16. A method as recited in claim 13 wherein said charge is injected through word line decoding circuitry of the same parity as that of said selected memory cell.

* * * * *